United States Patent
Shirota (10) Patent No.: US 8,223,541 B2
(45) Date of Patent: Jul. 17, 2012

(54) NON-VOLATILE SEMICONDUCTOR MEMORY, AND THE METHOD THEREOF

(75) Inventor: Riichiro Shirota, Tokyo (JP)

(73) Assignee: Powerchip Technology Corporation, Hsinchu (TW)

( * ) Notice: Subject to any disclaimer, the term of this patent is extended or adjusted under 35 U.S.C. 154(b) by 264 days.

(21) Appl. No.: 12/630,539

(22) Filed: Dec. 3, 2009

(65) Prior Publication Data

US 2010/0149870 A1 Jun. 17, 2010

(30) Foreign Application Priority Data

Dec. 4, 2008 (JP) .............................. 2008-309460

(51) Int. Cl.
*G11C 16/04* (2006.01)
(52) U.S. Cl. ......... 365/185.03; 365/185.17; 365/185.18; 365/185.22; 365/185.28
(58) Field of Classification Search .............. 365/185.03
See application file for complete search history.

(56) References Cited

U.S. PATENT DOCUMENTS

| | | | | |
|---|---|---|---|---|
| 7,259,991 B2* | 8/2007 | Aritome | ................... | 365/185.17 |
| 7,366,013 B2* | 4/2008 | Roohparvar | ............. | 365/185.03 |
| 7,474,560 B2* | 1/2009 | Aritome | ................... | 365/185.17 |
| 7,698,615 B2* | 4/2010 | Kang et al. | .................... | 714/746 |
| 7,881,106 B2* | 2/2011 | Sukegawa | ................ | 365/185.03 |
| 2008/0043527 A1 | 2/2008 | Aritome | | |
| 2009/0168513 A1* | 7/2009 | Tanaka | ...................... | 365/185.03 |
| 2011/0199827 A1* | 8/2011 | Puzzilli et al. | ........... | 365/185.14 |

FOREIGN PATENT DOCUMENTS

| | | |
|---|---|---|
| JP | H09-147582 | 6/1997 |
| JP | 2000-285692 | 10/2000 |
| JP | 2001-028575 | 1/2001 |
| JP | 2003-346485 | 12/2003 |
| JP | 2007-226897 | 9/2007 |
| JP | 2008-084471 | 4/2008 |

* cited by examiner

*Primary Examiner* — Son Mai
(74) *Attorney, Agent, or Firm* — Muncy, Geissler, Olds & Lowe, PLLC (57) ABSTRACT

A non-volatile semiconductor memory and a writing method thereof are provided for preventing miswriting induced by gate-induced-drain leakage (GIDL). The non-volatile semiconductor memory comprises a non-volatile memory cell array 10 for recording multiple values by setting a plurality of different thresholds to each memory cell transistor that is connected in series between selection transistors Qs1 and Qs2 on two terminals of a selected bit line; and a control circuit 11 for controlling writing of the data from the memory cell array 10. The control circuit 11 records two values for at least a plurality of first memory cell transistors Q0, Q1, Q32 and Q33 respectively adjacent to the selection transistors Qs1 and Qs2 on two terminals of the bit line, and records more than three values for a plurality of second transistors Q2~Q31 other than the first memory cell transistors.

8 Claims, 6 Drawing Sheets

NON-VOLATILE SEMICONDUCTOR MEMORY, AND THE METHOD THEREOF

FIELD OF THE INVENTION

The invention relates to an electrically rewritable programmable non-volatile semiconductor memory device (EEPROM), such as a flash memory, etc, and a write-in method thereof.

DESCRIPTION OF THE RELATED ART

A highly integrated NAND-type non-volatile semiconductor memory device (refer to patent documents 1-4) well known in the art connects a plurality of memory cell transistors (hereinafter referred to as memory cells) to and between bit lines and source lines in series, so as to form a NAND string.

For a common NAND-type non-volatile semiconductor memory device, when erasing is performed, a high voltage, such as 20V, is applied to a semiconductor substrate thereof and 0V is applied to a word line thereof. As such, electrons are pulled out from a floating gate, i.e., the charge accumulation layer formed by poly-silicon material etc. And, the threshold voltage is lower than the erasing threshold voltage (for example, −3V). In addition, when write-in (programming) is performed, 0V is applied to the semiconductor substrate and a high voltage, such as 20V, is applied to a controlling gate. As a result, electrons are injected from the semiconductor substrate into the floating gate, thereby making the threshold voltage higher than the write-in threshold voltage (for example, 1V). The state of the memory cell which utilizes the threshold voltages may be determined by applying a readout voltage between the write-in threshold voltage and the readout threshold voltage (for example, 0V) to the control gate to determine whether a current is flowing thereto.

For example, patent document 5 provides a semiconductor memory device that reduces miswriting rate, including a plurality of electrically rewritable non-volatile memory cells connected in series. Two terminals of a non-volatile memory cell are respectively connected to a bit line and a source line by arranging an NAND cell unit having first and second selection gate transistors, so as to form a memory cell array. In the NAND cell unit, the first and second selection gate transistors are adjacent to each other. Then, a dummy cell is inserted into the semiconductor memory device and configured with a state of a threshold voltage which is higher than the erasing state of the memory cell.

[Patent Document 1] JP H09-147582.
[Patent Document 2] JP 2000-285692.
[Patent Document 3] JP 2003-346485.
[Patent Document 4] JP 2001-028575.
[Patent Document 5] JP 2008-084471.
[Patent Document 6] JP 2007-226897.

Figure 4:
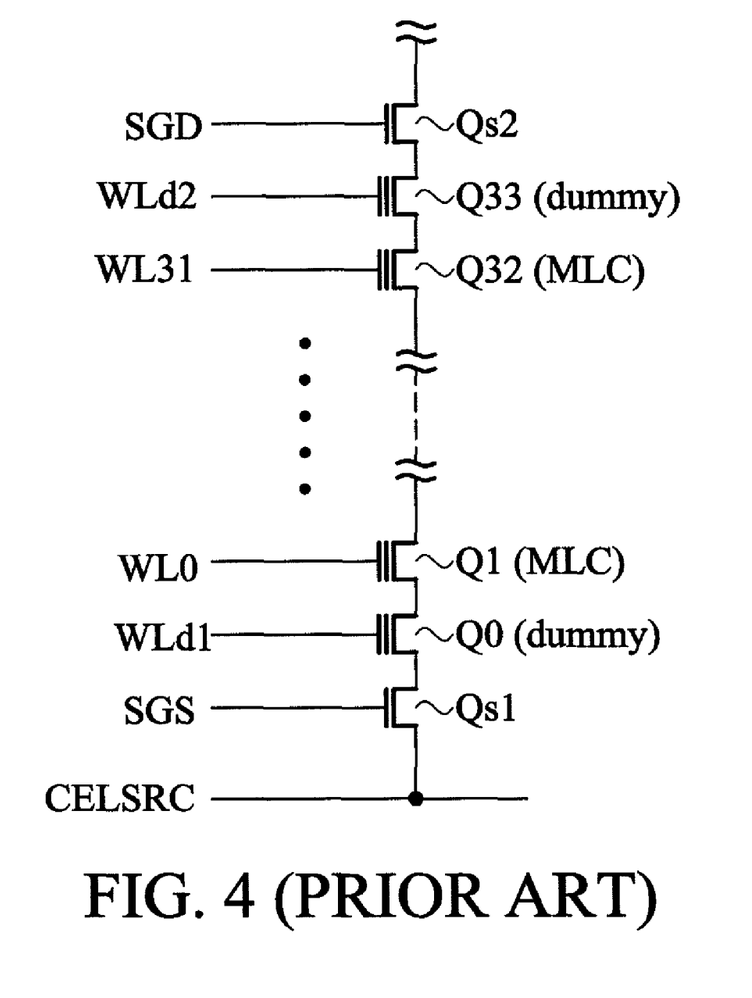
FIG. 4 is a schematic diagram illustrating a recording method for a bit line of a memory cell array 10 according to prior art.

FIG. 4 is a schematic diagram illustrating a recording method for a bit line of a memory cell array 10 according to prior art. As shown in FIG. 4, the memory cell transistors Q0 and Q33 respectively adjacent to the selection transistors Qs1 and Qs2 on two terminals of the bit line are typically regarded as dummy transistors. For example, other memory cell transistors Q1~Q32 are multi-level cells (MLC) for recording multiple values.

In FIG. 4, when two dummy transistors are inserted into the bit line according to prior art, gate-induced-drain leakage (GIDL) may be generated on the two adjacent bit lines WL0 and WL31, so as to result in miswriting. In this regard, as shown in FIG. 7 of patent document 6, the gate-induced-drain leakage (GIDL) specifically represents the problem when applying an inverted bias voltage to a gate and a drain. That is, when a large negative voltage is applied to the gate, the electrical field becomes more concentrated, thereby increasing the maximum electrical field. In this case, current leakage increases and hot carriers are generated due to high electrical field effect.

In FIG. 4, when writing data, a bit line selection control voltage $V_{SGD}$ is set as 1.5V, and a bit line selection control voltage $V_{SGS}$ is set as 0V. If a selected memory cell with a threshold voltage Vth inhibits programming, a positive potential ($V_{BL} \geq V_{SGD}$−Vth) is applied to the bit line, thereby making the distance D and the source/drain channel in the NAND string into a floating state. When the floating potential is substantially high, a breakdown may occur at the edge of the diffusion layer of the bit line selection transistors which control the voltages $V_{SGS}$ and $V_{SGD}$. In such a case, hot electrons would be injected from each bit line selection transistor into the memory cells connected to the first or second bit line WL. A minimal amount of hot electrons injected into the memory cells may not result in a problem, as the first memory cells in the bit lines WLd1 and WLd2 may be dummy. However, minimal amount of hot electrons injected into the memory cells may result in a problem, when the second memory cell is a memory cell operated as a multi-level cell (MLC).

BRIEF SUMMARY OF THE INVENTION

The invention provides a non-volatile semiconductor memory device and a write-in method thereof to mitigate the aforementioned problem and prevent occurrence of miswriting resulting from gate-induced-drain leakage (GIDL).

First, the invention provides a non-volatile semiconductor memory device including a non-volatile memory cell array for recording multiple values by setting a plurality of different threshold voltages to each memory cell transistor, wherein each memory cell transistor is connected in series between selection transistors on two terminals of a selected bit line. Also, a control circuit is included to control programmed data of the memory cell array, wherein the control circuit records two values for at least a plurality of first memory cell transistors respectively adjacent to the selection transistors on the two terminals, and records more than three multiple values for a plurality of second transistors other than the first memory cell transistors.

In the non-volatile semiconductor memory device, there are two values for two of the first memory cell transistors respectively adjacent to the selection transistors on the two terminals.

Additionally, in the non-volatile semiconductor memory device, the control circuit divides the data into a predetermined number and writes the data into each page of the first memory cell transistors recorded by the two values for recording the data.

Further, in the non-volatile semiconductor memory device, the control circuit sets a programming/verifying voltage of the first memory cell transistors recorded by the two values to a voltage which is lower than a verifying voltage for recording the data, and wherein the verifying voltage for recording the data has a maximum threshold voltage level for a plurality of recorded data recorded by the multiple values.

Furthermore, in the non-volatile semiconductor memory device, the control circuit sets a programming/verifying voltage of the first memory cell transistors recorded by the two values to a voltage which is lower than a verifying voltage for recording the data, and wherein the verifying voltage for recording the data has a low threshold voltage level which is lower than a maximum threshold voltage level for a plurality of recorded data recorded by the multiple values.

Second, the invention provides a write-in method for a non-volatile semiconductor memory device, wherein the non-volatile semiconductor memory device comprises a non-volatile memory cell array and a control circuit. The memory cell array records multiple values by setting a plurality of different threshold voltages to each memory cell transistor. Each memory cell transistor is coupled in series between selection transistors on two terminals of a selected bit line. The control circuit controls programmed data of the memory cell array. The write-in method comprises a control step for recording two values for at least a plurality of first memory cell transistors respectively adjacent to the selection transistors on the two terminals, and recording more than three multiple values for a plurality of second transistors other than the first memory cell transistors.

According to the write-in method for the non-volatile semiconductor memory device of the invention, the control step comprises the step of recording the two values for two of the first memory cell transistors respectively adjacent to the selection transistors on the two terminals.

In addition, according to the write-in method for the non-volatile semiconductor memory device of the invention, the control step comprises the step of dividing the data into a predetermined number and writing the data into each page of the first memory cell transistors recorded by the two values for recording the data.

Further, according to the write-in method for the non-volatile semiconductor memory device of the invention, the control step comprises the step of setting a programming/verifying voltage of the first memory cell transistors recorded by the two values to a voltage which is lower than a verifying voltage for recording the data, and wherein the verifying voltage for recording the data has a maximum threshold voltage level for a plurality of recorded data recorded by the multiple values.

Furthermore, according to the write-in method for the non-volatile semiconductor memory device, the control step comprises the step of setting the programming/verifying voltage of the first memory cell transistors recorded by the two values to a voltage which is lower than a verifying voltage for recording data, and wherein the verifying voltage for recording the data has a low threshold voltage level which is lower than a maximum threshold voltage level for a plurality of recorded data recorded by the multiple values.

Therefore, according to the non-volatile semiconductor memory device and the write-in method thereof of the invention, the control circuit records two values for at least a plurality of first memory cell transistors respectively adjacent to the selection transistors on the two terminals, and records more than three multiple values for a plurality of second transistors other than the first memory cell transistors. Compared with the conventional method of using dummy transistors, in addition to maintaining memory capacity, the embodiments of the invention decreases occurrence of gate-induced-drain leakage (GIDL); thereby decreasing occurrence of miswriting.

DETAILED DESCRIPTION OF THE INVENTION

The embodiments of the invention are given in the following with reference to the accompanying drawings. Further, in the following embodiments, the same number denotes the same element.

Figure 1:
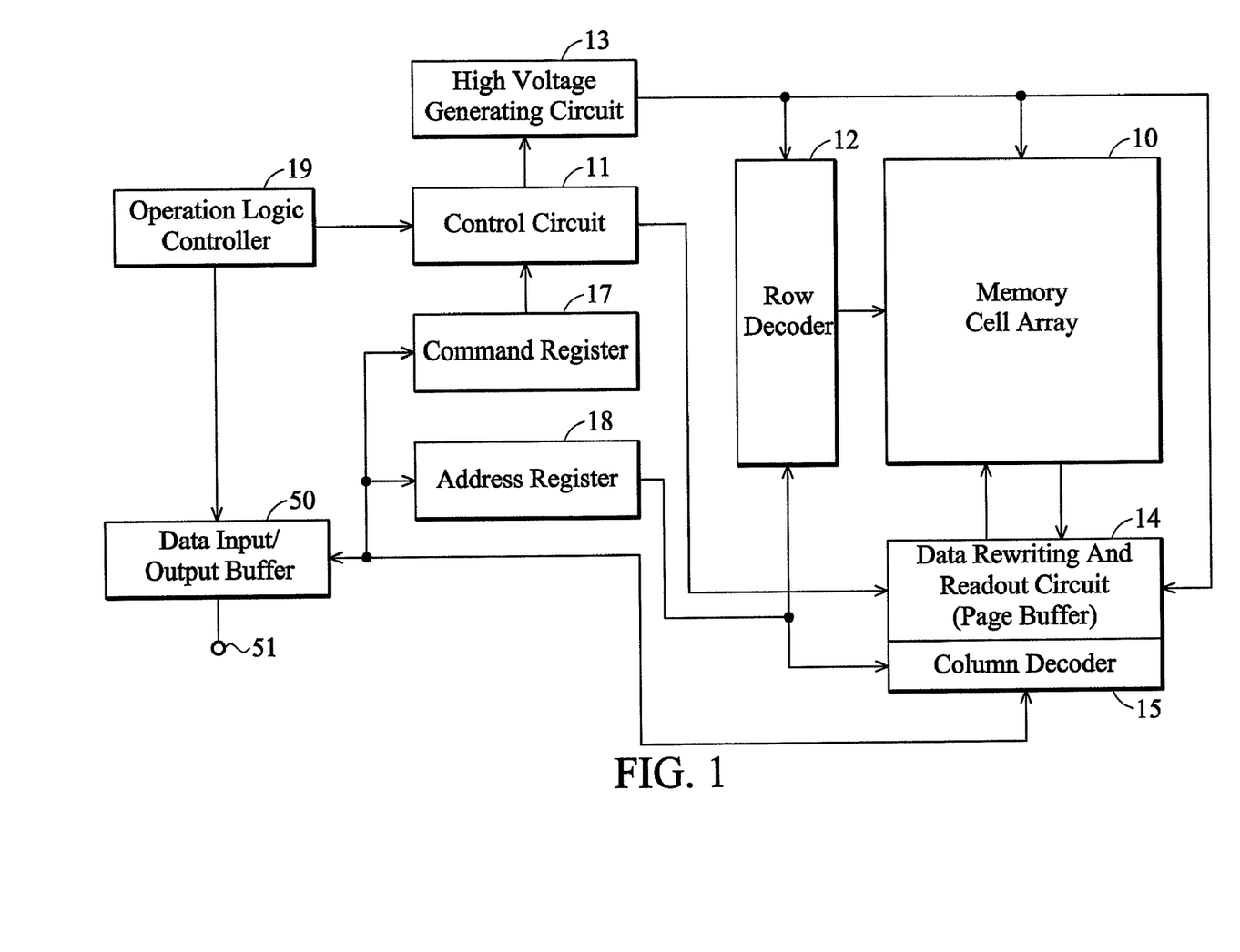
FIG. 1 is a block diagram illustrating the entire structure of a NAND-type flash EEPROM according to an embodiment of the invention.
Figure 2:
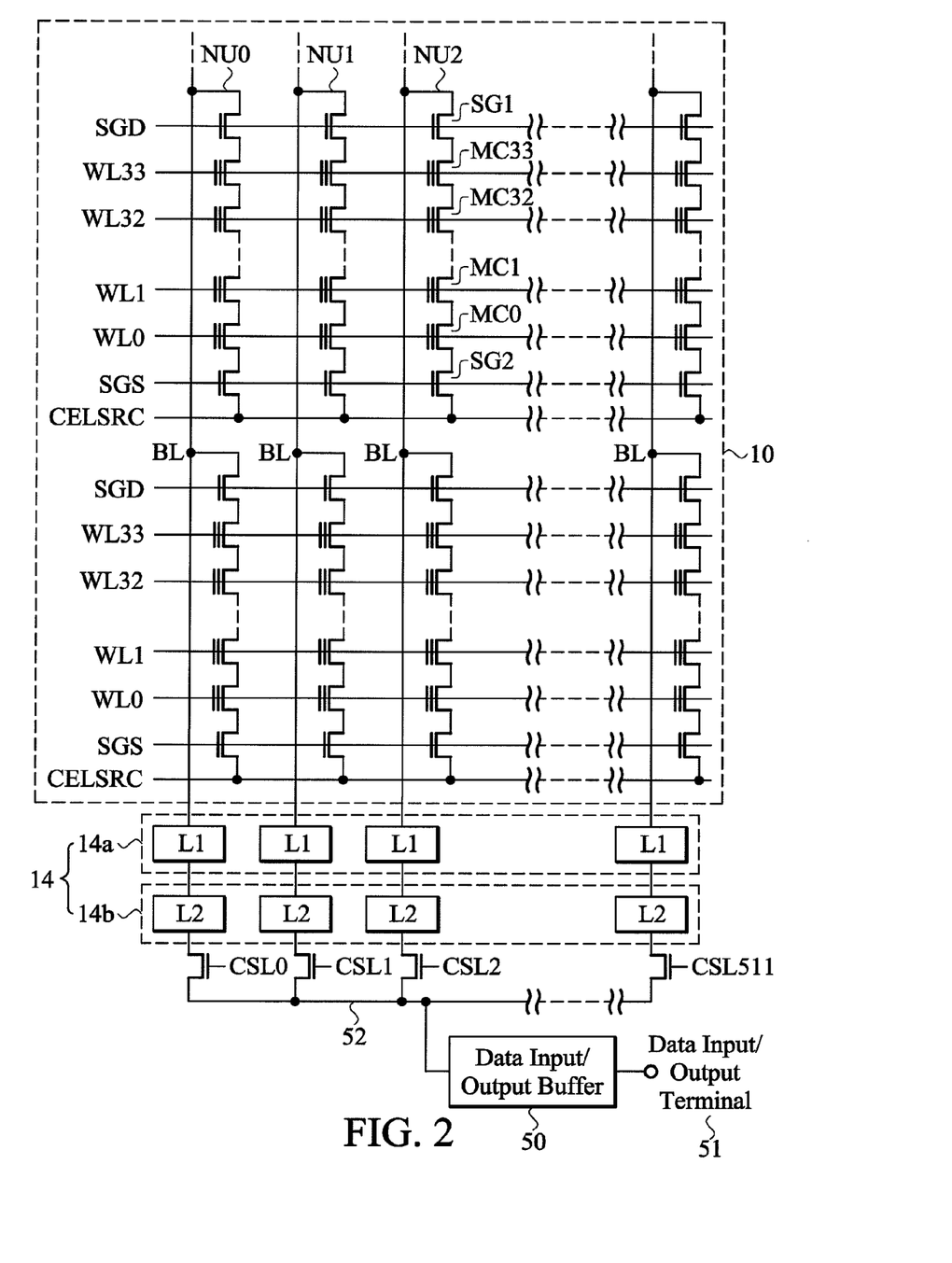
FIG. 2 is a schematic diagram illustrating a memory cell array 10 in FIG. 1 and the structure of the peripheral circuitry.

FIG. 1 is a block diagram illustrating the entire structure of a NAND-type flash electrically erasable programmable read-only memory (hereinafter referred to as EEPROM) according to an embodiment of the invention. In addition, FIG. 2 is a schematic diagram illustrating a memory cell array 10 in FIG. 1 and the structure of the peripheral circuitry. First, the structure of the NAND-type flash EEPROM is illustrated as follows.

In FIG. 1, the NAND-type flash EEPROM according to the embodiment comprises a memory cell array 10, a control circuit 11 that controls the operation of the memory cell array 10, a row decoder 12, a high voltage generating circuit 13, a data rewriting and readout circuit 14, a column decoder 15, a command register 17, an address register 18, an operation logic controller 19, a data input/output buffer 50 and a data input/output terminal 51.

For example, the memory cell array 10 as shown in FIG. 2 comprises NAND cell units (NU0, NU1, etc), and each NAND cell unit comprises 34 stack-gate structured electrically rewritable non-volatile memory cell MC0~MC33 connected in series. For each NAND cell unit NU, the drain terminal is connected to a bit line BL through the selection gate transistor SG1 and the source terminal is connected to a common source line CELSRC through the selection gate transistor SG2. The control gates of the memory cells MC0~MC33 arranged in parallel in the row direction are respectively connected to word lines WL0~WL33, and the gate electrodes of the selection gate transistors SG1, SG2 are connected to the selection gate lines SGD and SGS which are arranged in parallel to the word lines WL0~WL33. Note that one page, which indicates a range of the memory cells selected by one word line (from one of WL0~WL33), is a unit for write-in or readout. One block, which indicates a range of a plurality of NAND cell units NU within one page or integral multiples of one page, is a unit for data erasing. The rewriting and readout circuit 14 hereinafter referred to as a page buffer comprises a sense amplifier circuit (SA) and a latch circuit (DL) for data write-in and readout by the unit of one page.

The memory cell array 10 in FIG. 2 has a simplified structure and a plurality of bit lines may also share a page buffer. In this case, when data write-in or readout is performed, the number of bit lines selectively connected to the page buffer becomes the unit of one page. In FIG. 2, the range in the cell array for data input/output between the data input/output terminal 51 is illustrated. The row decoder 12 and the column decoder 15 are provided for respectively selecting the word line WL0~WL33 and the bit line BL of the memory cell array 10. The control circuit 11 controls the sequence of data write-in, erasing and readout. The high voltage generating circuit 13 controlled by the control circuit 11 is provided for generating an increased high voltage and a middle voltage for data write-in, erasing and readout.

The data input/output buffer 50 is used for data input/output and input of address signals. That is, data transmission is performed between the data input/output terminal 51 and the page buffer 14 through the data input/output buffer 50 and the data line 52. The address signals input from the data input/output terminal 51 are stored in the address register 18 and then sent to the row decoder 12 and the column decoder 15 for decoding. The command to control the operation is also input from the data input/output terminal 51. The input command is decoded and stored in the command register 17 to control the control circuit 11. The external control signals, such as chip enable signal CEB, command latch enable signal CLE, address latch enable signal ALE, write-in enable signal WEB, readout enable signal REB, etc, are readout to the operation logic controller 19 and the inner control signals corresponding to an operation mode are then generated. The inner control signals are provided to control the data latch or transmission of the data input/output buffer 50 and are further transmitted to the control circuit 11.

It is noted that the page buffer 14 has two latch circuits 14a and 14b for switching of multiple value operation functions and cache functions.

Figure 3:
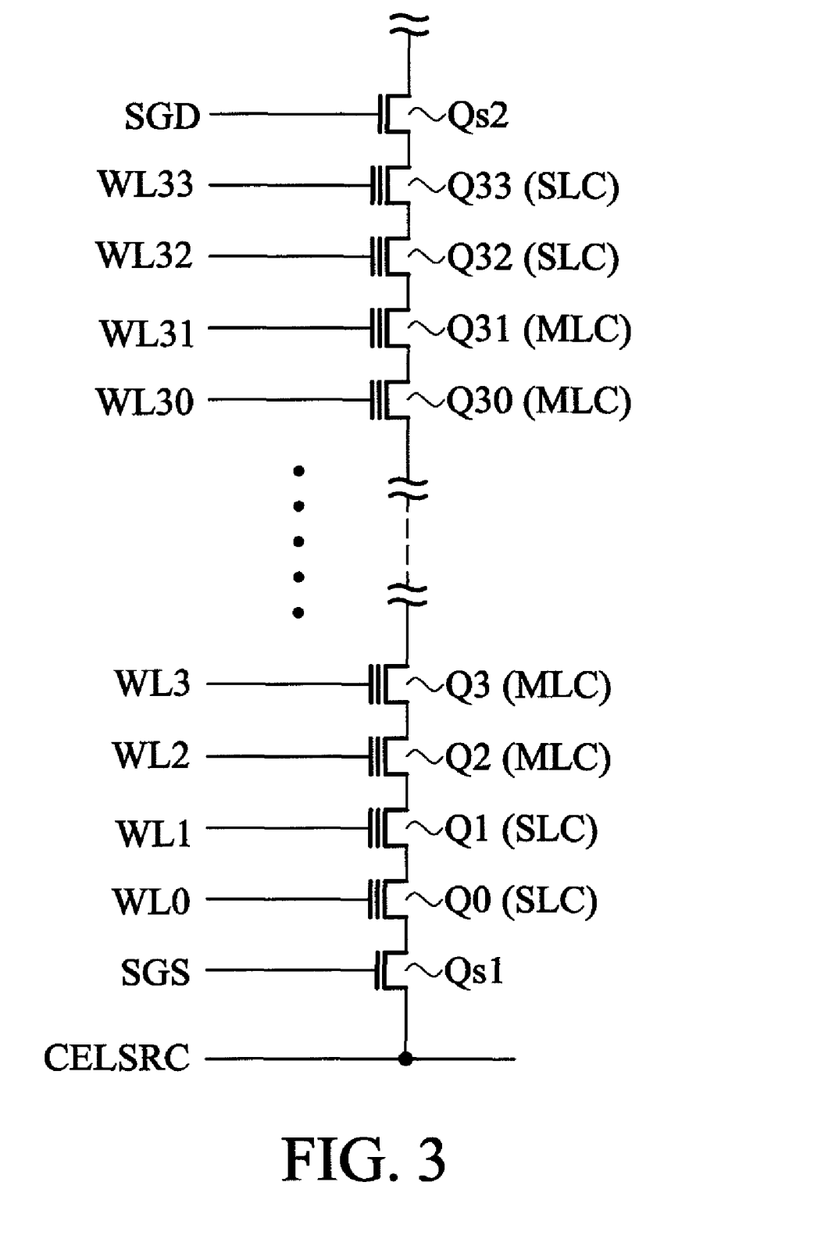
FIG. 3 is a schematic diagram illustrating a recording method for a bit line of a memory cell array 10 according to an embodiment of the invention.

Next, a write-in method for a non-volatile semiconductor memory device for preventing occurrence of miswriting resulting from gate-induced-drain leakage (GIDL) according to the invention is described in detail with reference to FIG. 3. FIG. 3 is a schematic diagram illustrating a recording method for a bit line of a memory cell array 10 according to an embodiment of the invention.

In the embodiment of FIG. 3, at least two single-level cells (SLC) are arranged on each of the two terminals, such as memory cell transistors Q0, Q1, Q32, and Q33, and respectively adjacent to the selection transistors Qs1 and Qs2. Such a structure may reduce gate-induced-drain leakage (GIDL) and increase the safety margin for occurrence of miswriting.

That is, according to the embodiment of the invention, the first and second word line WL are respectively adjacent to the bit line selection transistor Qs1 and Qs2 (at a nearest location) and connected to the memory cell transistors Q0, Q1, Q32, and Q33, which are used as single-level cells (SLC) for storing two values in a bit, thereby mitigating gate-induced-drain leakage. Due to the distribution of the threshold voltage (Vth), which indicates the states (for example, 4 values, "11", "01", "10" and "00") of the memory cell transistors Q2~Q31 of the multi-level cells (MLC) being limited to 1V, the injection of unnecessary hot electrons is prevented when programming is inhibited. Miswriting may also be prevented when few electrons are injected. This is because for the memory cell transistors Q0, Q1, Q32, and Q33 of the single-level cells (SLC), the distribution of the threshold voltage (Vth) which indicates the two states "1" and "0" may be maintained at above 2V. In addition, an appropriate readout voltage and write-in (program)/verify voltage may be set for the case of two values since two larger intervals may be obtained from the distribution of the threshold voltage (Vth), even if the intervals are narrowed due to some hot electron injections.

From the aforementioned description, according to the non-volatile semiconductor memory device and the write-in method thereof in accordance with the embodiment of the invention, two memory cell transistors, such as Q0, Q1, and Q32, Q33, are respectively adjacent to the selection transistor Qs1 and Qs2 on the two terminals of the bit line and are used as single-level cells (SLC) for recording. In addition, other memory cell transistors Q2~Q31 are used as multi-level cells (MLC) for recording control. Therefore, compared with the conventional dummy transistors, in addition to maintaining the memory capacity, gate-induced-drain leakage (GIDL) decreases; thereby preventing occurrence of miswriting.

First Modified Embodiment

Figure 5:
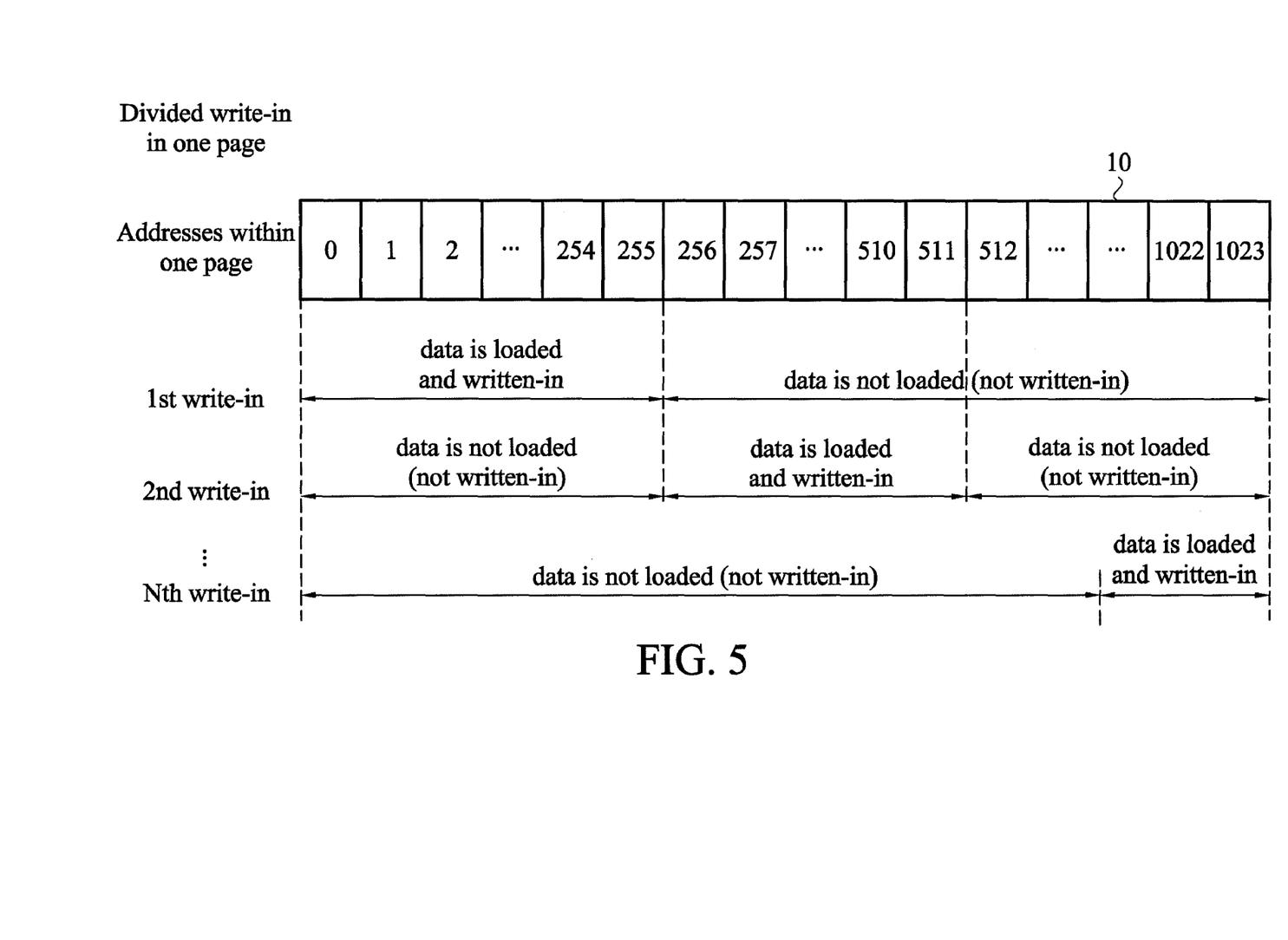
FIG. 5 is a diagram illustrating a divided write-in method in a page according a first modified embodiment of the invention.

FIG. 5 is a diagram illustrating a divided write-in method in a page according a first modified embodiment of the invention. In the aforementioned embodiments, although the divided write-in in one page is not allowed for the memory cell recorded by the single-level cell (SLC), the divided write-in may still be performed as shown in FIG. 5. That is, the control circuit 11 as shown in FIG. 5 may divide the data into a predetermined number and then write the data into each page of the memory cell transistors Q0, Q1, and Q32, Q33 that are used as single-level cells (SLC) for recording the data. In FIG. 5, for example, different data may be written into each of the 256 addresses within the recording area of one page (address 0~1023). Specifically, the area of the single-level cell (SLC) of the memory cell transistor Q33 may be regarded as the area for data management, so as to facilitate further data write-in. For example, change in the parameters, or use of flags or counts, may be stored in the page data area of the memory cell transistor Q33.

Second Modified Embodiment

Figure 6:
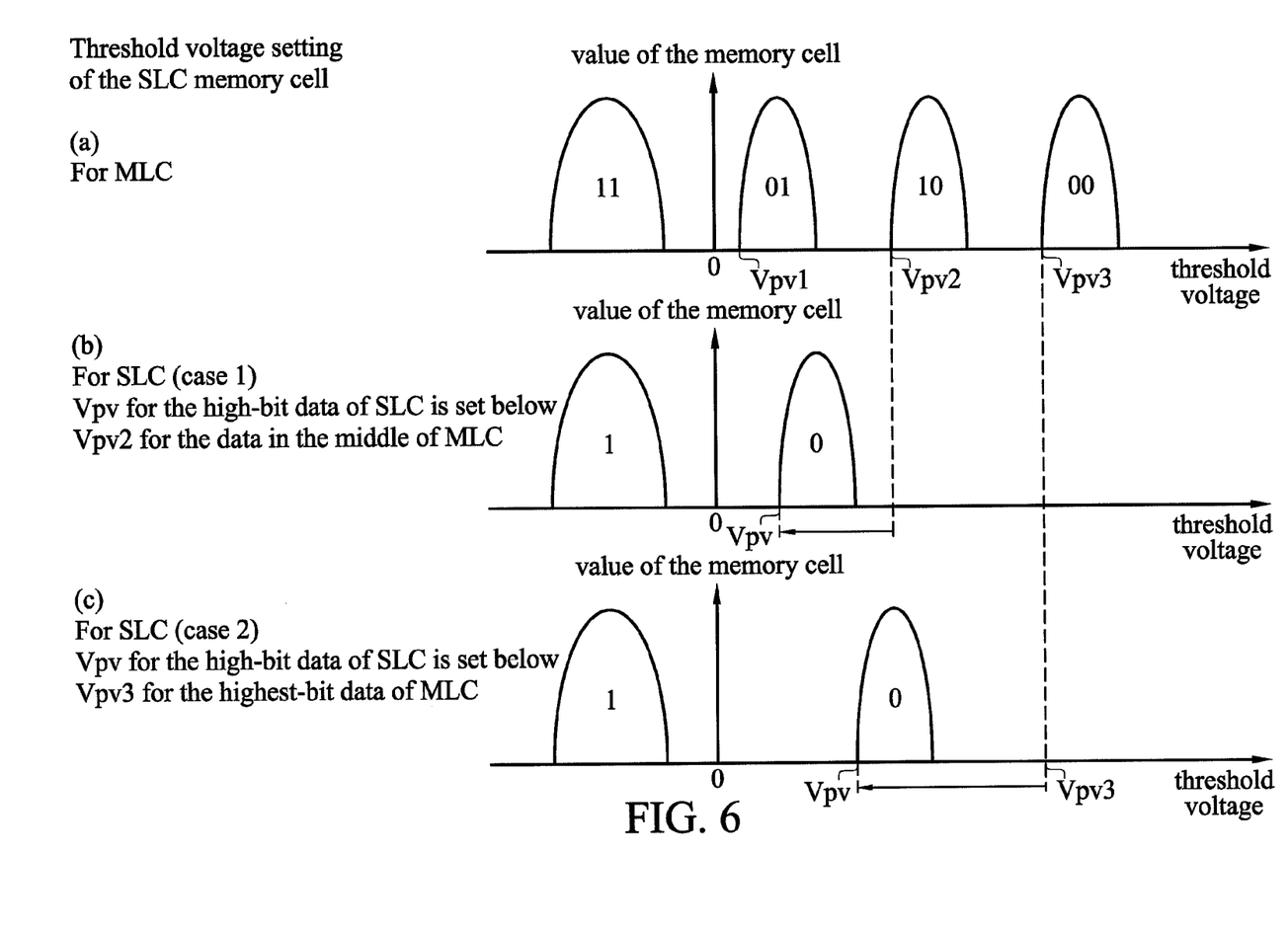
FIG. 6 is a diagram illustrating a method for setting a threshold voltage Vth of an SLC memory cell according to a second modified embodiment of the invention.

FIG. 6 is a diagram illustrating a method for setting a threshold voltage Vth of an SLC memory cell according to a second modified embodiment of the invention. In this regard, FIG. 6(a) illustrates the distribution of the threshold voltage and the programming/verifying voltages Vpv1, Vpv2 and Vpv3 in the case of multi-level cell (MLC) recording. In FIG. 6(b), in the case of single-level cell (SLC) recording, the programming/verifying voltage Vpv for the high-bit data (recorded data 0) of the single-level cell (SLC) is set to below the programming/verifying voltage Vpv2 for the recorded data 10 in the middle of multi-level cell (MLC) recording (the recorded data is only required to be recorded at a threshold voltage level that is lower than the recorded data at a maximum threshold voltage level). Moreover, in FIG. 6(c), in the case of single-level cell (SLC) recording, the programming/verifying voltage Vpv for the high-bit data (recorded data 0) of the single-level cell (SLC) is set to below the programming/verifying voltage Vpv3 for the recorded data 00 at the maximum threshold voltage level of multi-level cell (MLC) recording.

For single-level cell (SLC) recording, when setting the threshold voltages of the memory cell transistors Q0, Q1, Q32, and Q33, the readout voltage is generally set as R1=0V, and the programming/verifying voltage is set as Vpv=0.5~1.0V. As mentioned above, it is possible to flexibly set R1=0.5~1.0V and Vpv=1.0~2.0V. When the programming/verifying voltages of the memory cell transistor Q0, Q1, Q32, and Q33 for single-level cell (SLC) recording are set below the maximum threshold voltage level for the multi-level cell (MLC) recording, the reliability of single-level cell (SLC) recording is better than that of multi-level cell (MLC) recording, so as to achieve a particular effect for use in the aforementioned first modified embodiment.

Other Modified Embodiments

From the above-mentioned embodiments, the description of NAND-type flash EEPROM is illustrated, but is not limited thereto. The invention may also be applied to a non-volatile semiconductor memory device, such as a NOR-type flash EEPROM and so on, for writing data into floating gates.

From the aforementioned embodiments, a multi-level cell (MLC) is assumed to be a level cell with 4 values, but is not limited thereto. A multi-level cell with more than 3 values may also be used.

Moreover, according to the aforementioned embodiments, single-level cell (SLC) recording is provided for the two memory cell transistors which are respectively adjacent to the bit line selection transistors on the two terminals of the selected bit line. However, single-level cell (SLC) recording may also be provided for more than 3 memory cell transistors which are respectively adjacent to the bit line selection transistors on the two terminals.

From the aforementioned description, according to the non-volatile semiconductor memory device and the write-in method thereof associated with the invention, the control circuit records two values for at least a plurality of first memory cell transistors respectively adjacent to the selection transistors on the two terminals. In addition, the control circuit records more than three multiple values for a plurality of second transistors other than the first memory cell transistors. Compared with the conventional method of using dummy transistors, in addition to maintaining memory capacity, the embodiments of the invention decreases occurrence of gate-induced-drain leakage (GIDL); thereby decreasing occurrence of miswriting.

SYMBOL DESCRIPTION OF THE DRAWINGS

10~non-volatile memory cell array;
11~control circuit;
12~row decoder;
13~high voltage generating circuit;
14~data rewriting and readout circuit (page buffer);
14a, 14b~latch circuit;
L1, L2~latch;
15~column decoder;
17~command register;
18~address register;
19~operation logic controller;
50~data input/output buffer;
51~data input/output terminal;
52~data line;
Q0~Q33~memory cell transistor;
SGD-SGS~selection gate line;
CELSRC~common source line;
Qs1-Qs2~bit line selection transistor; and
WL0~WL33~word line.

What is claimed is:

1. A non-volatile semiconductor memory device, comprising:
a non-volatile memory cell array for recording multiple values by setting a plurality of different threshold voltages to each memory cell transistor, wherein each memory cell transistor is connected in series between selection transistors on two terminals of a selected bit line; and
a control circuit for controlling programmed data of the memory cell array,
wherein the control circuit records two values for at least a plurality of first memory cell transistors respectively adjacent to the selection transistors on the two terminals, and records more than three multiple values for a plurality of second transistors other than the first memory cell transistors, and sets a programming/verifying voltage of the first memory cell transistors recorded by the two values to a voltage which is lower than a verifying voltage for recording the data, and the verifying voltage for recording the data has a maximum threshold voltage level for a plurality of recorded data recorded by the multiple values.

2. The non-volatile semiconductor memory device as claimed in claim 1, wherein the control circuit records the two values for two of the first memory cell transistors respectively adjacent to the selection transistors on the two terminals.

3. The non-volatile semiconductor memory device as claimed in claim 2, wherein the control circuit divides the data into a predetermined number and writes the data into each page of the first memory cell transistors recorded by the two values for recording the data.

4. The non-volatile semiconductor memory device as claimed in claim 1, wherein the verifying voltage for recording the data has a low threshold voltage level which is lower than the maximum threshold voltage level for a plurality of recorded data recorded by the multiple values.

5. A write-in method for a non-volatile semiconductor memory device, wherein the non-volatile semiconductor memory device comprises a non-volatile memory cell array and a control circuit, the memory cell array records multiple values by setting a plurality of different threshold voltages to each memory cell transistor, each memory cell transistor is coupled in series between selection transistors on two terminals of a selected bit line, and the control circuit controls programmed data of the memory cell array, comprising:
a control step for recording two values for at least a plurality of first memory cell transistors respectively adjacent to the selection transistors on the two terminals, and recording more than three multiple values for a plurality of second transistors other than the first memory cell transistors; and
setting a programming/verifying voltage of the first memory cell transistors recorded by the two values to a voltage which is lower than a verifying voltage for recording the data, and the verifying voltage for recording the data has a maximum threshold voltage level for a plurality of recorded data recorded by the multiple values.

6. The write-in method as claimed in claim 5, wherein the control step further comprises the step of:
recording the two values for two of the first memory cell transistors respectively adjacent to the selection transistors on the two terminals.

7. The write-in method as claimed in claim 5, wherein the control step further comprises the step of:
dividing the data into a predetermined number and writing the data into each page of the first memory cell transistors recorded by the two values for recording the data.

8. The write-in method as claimed in claim 5, wherein the verifying voltage for recording the data has a low threshold voltage level which is lower than the maximum threshold voltage level for a plurality of recorded data recorded by the multiple values.

* * * * *